(12) United States Patent
Tretter et al.

(10) Patent No.: US 6,928,581 B1
(45) Date of Patent: Aug. 9, 2005

(54) INNOVATIVE BYPASS CIRCUIT FOR CIRCUIT TESTING AND MODIFICATION

(75) Inventors: Larry LeeRoy Tretter, Tucson, AZ (US); James Ernest Malmberg, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 448 days.

(21) Appl. No.: 09/395,854

(22) Filed: Sep. 14, 1999

(51) Int. Cl.[7] .................................................. G06F 11/00
(52) U.S. Cl. ............................................ 714/8; 714/718
(58) Field of Search ............................ 714/8, 30, 718, 714/735, 738; 375/229

(56) References Cited

U.S. PATENT DOCUMENTS

| | | | | |
|---|---|---|---|---|
| 3,961,251 A | | 6/1976 | Hurley et al. ................. 324/73 |
| 3,961,252 A | | 6/1976 | Eichelberger ................ 324/73 |
| 4,357,703 A | | 11/1982 | Van Brunt .................... 371/15 |
| 4,782,283 A | | 11/1988 | Zasio .......................... 324/73 |
| 4,931,722 A | | 6/1990 | Stoica ........................ 371/22.5 |
| 5,107,208 A | * | 4/1992 | Lee ............................ 714/733 |
| 5,168,499 A | * | 12/1992 | Peterson et al. ............. 714/30 |
| 5,200,963 A | * | 4/1993 | Chau et al. .................. 714/820 |
| 5,254,940 A | | 10/1993 | Oke et al. .................... 324/158 |
| 5,469,075 A | | 11/1995 | Oke et al. .................... 324/763 |
| 5,568,492 A | | 10/1996 | Flint et al. .................. 371/22.1 |
| 5,642,057 A | | 6/1997 | Oke et al. .................... 324/763 |
| 5,663,967 A | * | 9/1997 | Lindberg et al. ............ 714/737 |
| 5,930,231 A | * | 7/1999 | Miller et al. ................ 370/210 |
| 6,021,513 A | * | 2/2000 | Beebe et al. ................ 714/726 |
| 6,226,322 B1 | * | 5/2001 | Mukherjee ................ 333/28 R |
| 6,275,524 B1 | * | 8/2001 | Spagna ...................... 327/159 |
| 6,385,253 B1 | * | 5/2002 | Swisher ..................... 375/222 |
| 6,571,364 B1 | * | 5/2003 | Maeno et al. .............. 714/736 |

* cited by examiner

*Primary Examiner*—Robert Beausoliel
*Assistant Examiner*—Gabriel Chu
(74) *Attorney, Agent, or Firm*—Douglas R. Millett; William D. Gill; Dillon & Yudell LLP

(57) ABSTRACT

An integrated circuit module is designed with bypass switches in critical places to route signals around specific circuit blocks, e.g. an automatic gain control (AGC) system and an anti-aliasing filter. If there had been significant problems with either block, it can be bypassed and tests of the remaining circuits are possible. This allows all circuits in the module to be tested in the initial pass, reducing the risk of needing a third pass after the known problems were fixed in the second pass. Additionally, the bypass circuits are useful at module production test and for diagnostics in the final product.

1 Claim, 3 Drawing Sheets

INNOVATIVE BYPASS CIRCUIT FOR CIRCUIT TESTING AND MODIFICATION

BACKGROUND OF THE INVENTION

1. Technical Field

The present invention generally relates to improved means for testing integrated circuits and in particular to test circuits for integrated circuit chips. Still more particularly, the present invention relates to an improved means for testing integrated circuits by bypassing failed elements.

2. Description of the Related Art

In developing analog modules involving complex blocks of circuitry there is significant risk that a design defect will cause a block to be inoperative. If so, the initial fabrication pass of the module may be totally useless, adversely affecting the development schedule of the products depending on the module.

Even if the module is tested, often these tests will not show which of the component circuits of the module is defective, or if more than one component is defective. Because the module components are often connected in series, if one component of the module is defective, it is impossible to test any components downstream of the known defective component.

This makes the process of testing the module extremely difficult. While it may be possible to repair a defective circuit component of the module, until it is repaired, it is impossible to even test the components downstream of the defective module. Since this is the case, it is difficult to determine if the module is even worth repairing until after too much time and expense has already been invested. It would therefore be desirable to have a means to bypass a defective component in order to test other components of the module.

SUMMARY OF THE INVENTION

It is therefore one object of the present invention to provide improved means for testing integrated circuits.

It is another object of the present invention to provide an improved means to test circuits for integrated circuit chips.

It is yet another object of the present invention to provide an improved means for testing integrated circuits by bypassing failed elements.

The foregoing objects are achieved as is now described. An integrated circuit module is designed with bypass switches in critical places to route signals around specific circuit blocks, e.g. an automatic gain control (AGC) system and an anti-aliasing filter. If there had been significant problems with either block, it can be bypassed and tests of the remaining circuits are possible. This allows all circuits in the module to be tested in the initial pass, reducing the risk of needing a third pass after the known problems were fixed in the second pass. Additionally, the bypass circuits are useful at module production test and for diagnostics in the final product. Further, by allowing specific stages of a module to be bypassed, the module can be easily customized for different applications.

The above as well as additional objectives, features, and advantages of the present invention will become apparent in the following detailed written description.

DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
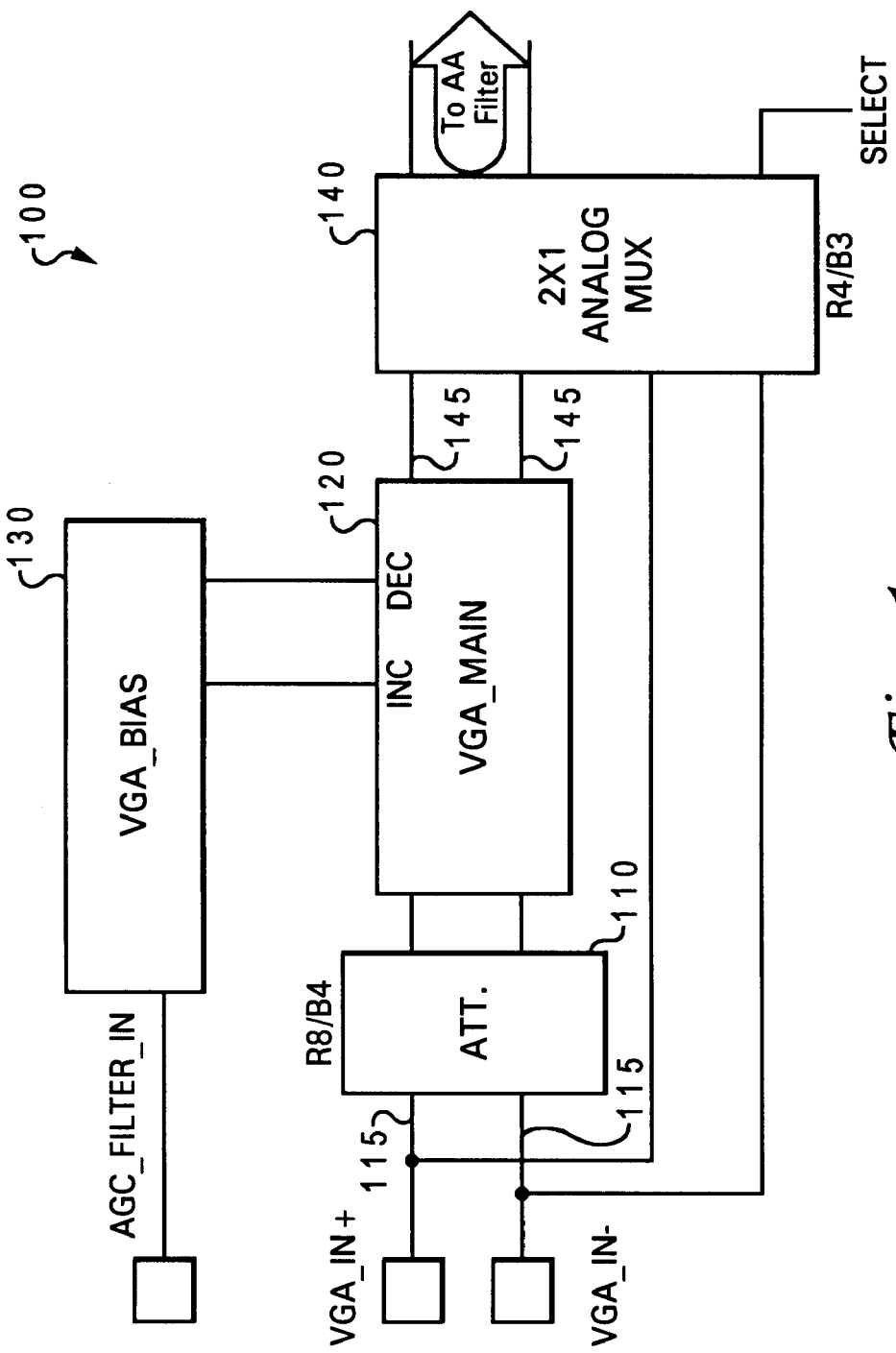
FIG. 1 depicts an automatic gain control stage with a bypass circuit in accordance with a preferred embodiment of the present invention.

With reference now to the figures, and in particular with reference to FIG. 1, a circuit is disclosed for selectively bypassing a circuit block in an integrated circuit module. While the innovative circuits are described below with reference to an analog front end (AFE) module and automatic gain control (AGC) and anti-aliasing filter (AAF) circuits, those of skill in the art will recognize that the bypass circuit described below will work very well in any number of circuits.

Figure 2:
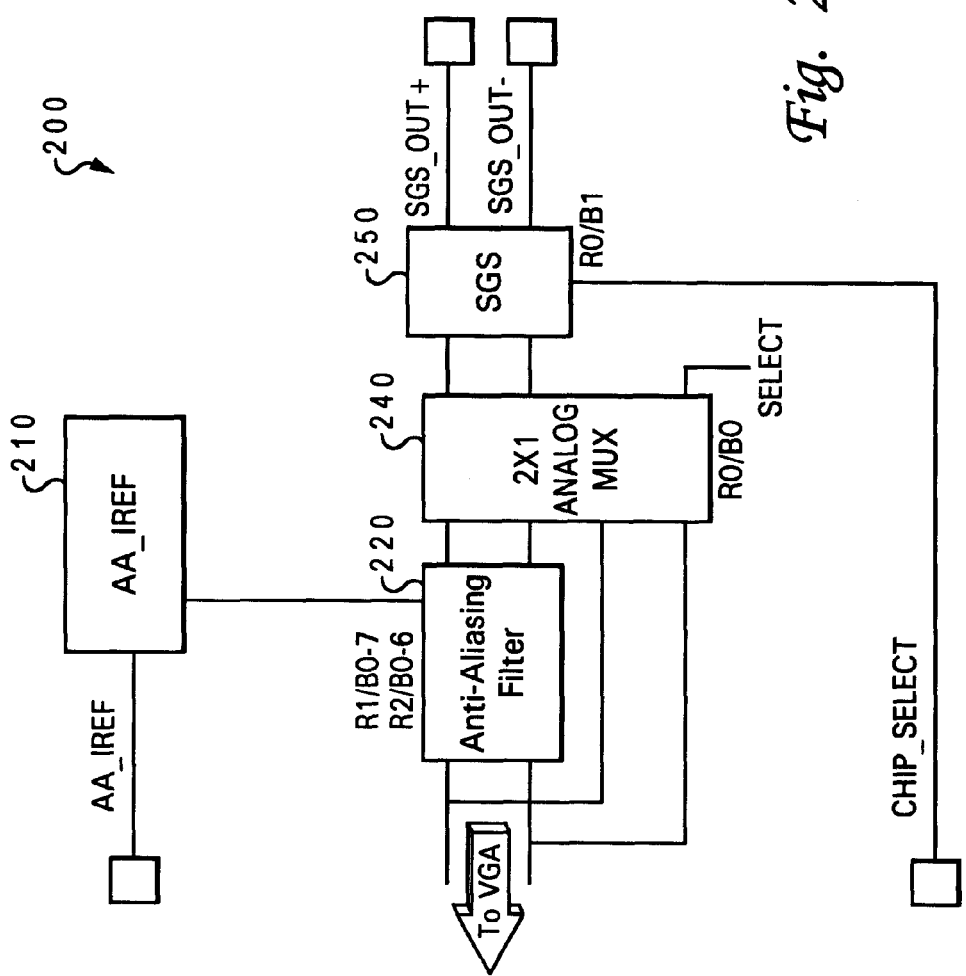
FIG. 2 is an anti-aliasing stage with a bypass circuit in accordance with a preferred embodiment of the present invention.

As shown in FIG. 1, the 2×1 ANALOG MUX circuit 140 in the AGC system 100, which comprises blocks 110, 120, and 130, allows either the input to the AGC, at pins 115, or the output of the AGC, at pins 145, to be sent to the anti-aliasing filter (shown in FIG. 2). By sending the input of the AGC system through the bypass of MUX 140 to the anti-aliasing filter, the AGC system is disabled and has no effect on the signal output of the AFE. The 2×1 ANALOG MUX is controlled at the SELECT input by a register bit set by the serial interface in the AFE module.

The AGC module includes, for the sake of illustration, VGA_BIAS block 130, ATT. block 110, and VGA_MAIN block 120. ATT. block 110 provides an attenuation of the differential signal to the input of the VGA_MAIN block 120. Of course, the MUX bypass circuit can be used, as shown in this diagram, to bypass any circuit by connecting both the input and output of the circuit to be bypassed to the MUX.

With reference now to FIG. 2, a similar 2×1 ANALOG MUX 240 is included in the anti-aliasing filter stage 200 and allows the anti-aliasing filter block 220 to be bypassed. This MUX is also controlled, at its SELECT input, by a serial interface register bit. Here, the MUX 240 has inputs connected to both the VGA input of anti-aliasing filter block 220 and the output of anti-aliasing filter block 220. According to the signal received at the SELECT input to MUX 240, one of these signal sets will be passed to SGS block 250. Also shown here is reference current generator AA_IREF 210, connected to anti-aliasing circuit block 220.

The 2×1 ANALOG MUX circuit 140/240 is, in the preferred embodiment, a very simple broadband two input, one output amplifier, with a gain of 2. Since the MUX is such a relatively simple device, the possibility of problems in the MUX circuit are much less than the far more complicated AGC system or anti-aliasing filter.

For early module testing to verify the performance of the individual blocks it is very useful to reduce the amount of extraneous circuitry. According to the preferred embodiment, bypassing the AGC allows the frequency response of the anti-aliasing filter to be studied more easily and bypassing the anti-aliasing filter allows the AGC response to be tested without being affected by the anti-aliasing filter. Should a problem develop with either the filter or AGC, it is still possible to make measurements on the other block. The ability to study each block in isolation increases the likelihood that problems can be quickly and correctly identified.

Figure 3:
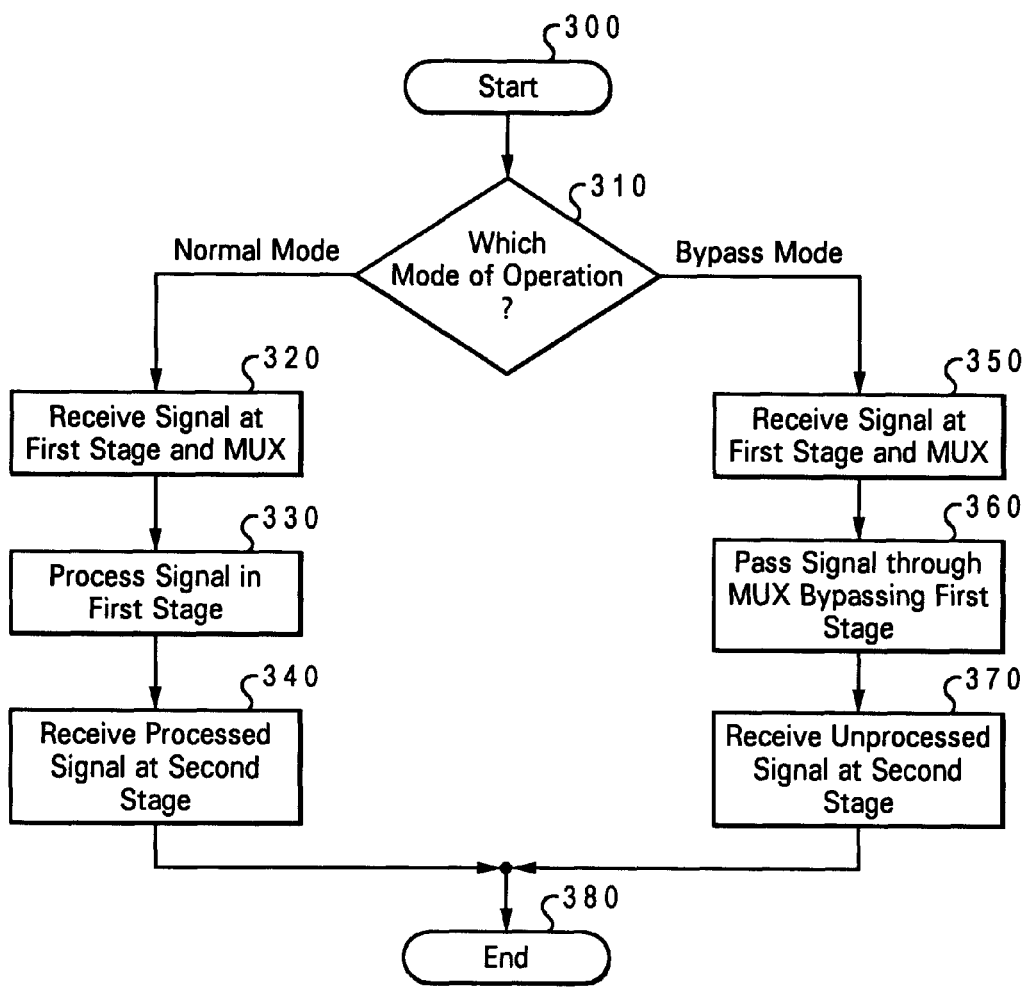
FIG. 3 depicts a flowchart of a process in accordance with a preferred embodiment of the present invention.

With reference now to FIG. 3, a flowchart of a process in a accordance with the preferred embodiment is shown. Here, the process starts when a signal is passed to a chip (step 300). The mode of operation is determined according to the MUX select input, as described above (step 310). If the module is operating in its normal mode, the signal is passed to a first stage, which can be any given circuit stage, at a common connection with a first input of the MUX (step 320). Next, the first stage processes the signal according to the function of the stage (step 330). After processing, the signal is output from the first stage and sent to the next stage, which again can be any given circuit stage, or can be the output of the module (step 340). The process then ends (step 380).

If the module is operating in its "bypass" mode, the signal is passed to the first stage, as in the normal mode, at a common connection with a first input of the MUX (step 350). Next, the MUX accepts the signal and bypasses the first stage (step 360). The signal is output from the MUX and sent directly to the next stage, which again can be any given circuit stage, or can be the output of the module (step 370). The process then ends (step 380).

The bypass circuits of the preferred embodiment are also useful for production module testing. They allow the outputs from the AGC system to be directly observed and inputs to the anti-aliasing filter to be made directly, without needing extra module pins.

A bypass circuit according to the preferred embodiment also provide an easy way to customize chip operation. For example, in the analog front-end module described above, there are applications where only the anti-aliasing filter is required. The AGC bypass allows the configuration of the AFE into a filter module to replace a potential end-of-life filter in an existing product.

The penalty for the advantages listed above is the inclusion of extra circuitry in the module. However, being a very simple circuit the MUX does not require a large amount of chip area and was deemed to be a reasonable trade-off for the advantages gained.

In conventional systems, AGC stages such as that described above are disabled by forcing a fixed voltage onto the AGC gain control line. This approach does not help in early first pass module tests as it assumes the AGC system is working correctly, which may not be the case. Further, this approach does not allow a defective AGC to be bypassed in order to use the preamplifier and anti-aliasing portions of the module for continued product development.

While the invention has been particularly shown and described with reference to a preferred embodiment, it will be understood by those skilled in the art that various changes in form and detail may be made therein without departing from the spirit and scope of the invention. In particular, while the specific examples above are drawn to an AFE module with automatic gain-control and anti-aliasing filter stages, the innovative bypass circuit can be used in any number of analog or digital circuits where specific circuit blocks might need to be bypassed.

What is claimed is:

1. A method for testing an integrated circuit having a first stage and a second stage, the method comprising:

testing an integrated circuit, which has a first stage and a second stage, by serially propagating a signal through the first stage and then through the second stage; and upon the testing detecting a defect in the integrated circuit, retesting the integrated circuit while bypassing the first stage, wherein a re-detection of the defect by the retesting of the integrated circuit indicates that the first stage is non-defective, and a detection of no defect in the integrated circuit by the retesting of the integrated circuit indicates that the first stage is defective.

* * * * *